(12) United States Patent
Konyuba et al.

(10) Patent No.: US 11,658,000 B2
(45) Date of Patent: May 23, 2023

(54) SAMPLE SUPPORT AND METHOD OF FABRICATING SAME

(71) Applicant: JEOL Ltd., Tokyo (JP)

(72) Inventors: Yuji Konyuba, Tokyo (JP); Tomohiro Haruta, Tokyo (JP); Yuta Ikeda, Tokyo (JP); Tomohisa Fukuda, Tokyo (JP)

(73) Assignee: JEOL Ltd., Tokyo (JP)

( * ) Notice: Subject to any disclaimer, the term of this patent is extended or adjusted under 35 U.S.C. 154(b) by 389 days.

(21) Appl. No.: 16/916,720

(22) Filed: Jun. 30, 2020

(65) Prior Publication Data

US 2021/0005418 A1    Jan. 7, 2021

(30) Foreign Application Priority Data

Jul. 1, 2019   (JP) .............................. JP2019-122792

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2002* (2013.01); *H01J 2237/2007* (2013.01)

(58) Field of Classification Search
None
See application file for complete search history.

(56) References Cited

U.S. PATENT DOCUMENTS

| | | | |
|---|---|---|---|
| 6,187,482 B1 | 2/2001 | Kuroda et al. | |
| 2006/0269453 A1* | 11/2006 | Roitman | ............... B01L 3/5088 422/400 |
| 2016/0118511 A1 | 4/2016 | Paire et al. | |

FOREIGN PATENT DOCUMENTS

| | | | | |
|---|---|---|---|---|
| CN | 103335984 A | | 10/2013 | |
| JP | H055682 A | | 1/1993 | |
| JP | 2002131327 A | | 5/2002 | |
| JP | 2006153532 A | * | 6/2006 | |
| JP | 2006153532 A | | 6/2006 | |
| JP | 2007163447 A | * | 6/2007 | .............. H01J 37/20 |

OTHER PUBLICATIONS

Extended European Search Report issued in EP20182019.8 dated Feb. 3, 2021.
European Search Report issued in EP20182019.8 dated Oct. 29, 2020.

* cited by examiner

*Primary Examiner* — Andrew Smyth
(74) *Attorney, Agent, or Firm* — The Webb Law Firm

(57) ABSTRACT

There is provided a sample support capable of easily placing a sample into position. The sample support is used such that a sample floating on the surface of water is scooped and held. The sample support has: a first region on which the sample is to be placed; and a second region of higher wettability than the first region.

8 Claims, 16 Drawing Sheets

SAMPLE SUPPORT AND METHOD OF FABRICATING SAME

CROSS-REFERENCE TO RELATED APPLICATION

This application claims priority to Japanese Patent Application No. 2019-122792 filed Jul. 1, 2019, the disclosure of which is hereby incorporated by reference in its entirety.

BACKGROUND OF THE INVENTION

1. Field of the Invention

The present invention relates to a sample support and to a method of fabricating it.

2. Description of the Related Art

Where a TEM (transmission electron microscopy) sample is prepared using an ultramicrotome, ultrafoil sections cut with a diamond knife are unfolded over the surface of water (such as distilled water or pure water) previously stored in a knife board. The user scoops the ultrafoil sections floating on the surface of water using a TEM sample grid and dries them. Consequently, the sample is supported on the sample grid. This permits TEM observation of the sample (see, for example, JP-A-5-5682).

Where an SEM (scanning electron microscopy) sample is prepared using an ultramicrotome, the user scoops ultrafoil sections floating on the surface of water by the use of a smooth baseplate or substrate such as a glass substrate or a silicon substrate and dries them. Consequently, the sample is supported on the substrate. This allows for SEM observation of the sample.

Where a sample grid is in storage in the atmosphere, the surface of the grid will be contaminated, resulting in deterioration of the wettability of the grid. If one attempts to scoop ultrafoil sections floating on the surface of water using a sample grid of low wettability, the grid repels water. The water drops from the sample grid, whereby the ultrafoil sections may not be scooped. Therefore, an operation generally adopted is to hydrophilize the sample grid for improving the wettability of the surface of the grid before the ultrafoil sections are scooped.

A similar operation is performed when ultrafoil sections are scooped using a baseplate. That is, before the ultrafoil sections are scooped, the baseplate is hydrophilized to improve the wettability of the surface.

Where ultrafoil sections floating on the surface of water are scooped using a sample grid or baseplate as described above, it is difficult to place the ultrafoil sections into position on the sample grid.

SUMMARY OF THE INVENTION (1) One aspect of the sample support associated with the present invention is for use to hold a sample floating on the surface of water and has: a first region on which the sample is to be placed; and a second region of higher wettability than the first region.

If the sample floating on the water surface is scooped with this sample support, the second region of higher wettability loses its water earlier than the first region. Therefore, the sample is guided or urged to the first region and then the water on the first region dries, whereby the sample is left on the first region. Since the sample support is designed to have the first and second regions in this way, when the sample floating on the water surface is scooped and held, the sample can be easily placed into position.

(2) One aspect of the method associated with the present invention is for use to fabricate a sample support for holding a sample floating on the surface of water. This method involves forming a sample support film and forming a metal film on the sample support film. The sample support has: a first region on which the sample is to be placed; and a second region of higher wettability than the first region. The sample support film has a top surface that constitutes the first region. The metal film has a top surface that constitutes the second region.

With this method of fabricating a sample support, it is possible to fabricate the sample support having the first region and the second region of higher wettability than the first region.

DESCRIPTION OF THE INVENTION

The embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

1.1. Sample Support

Figure 1:
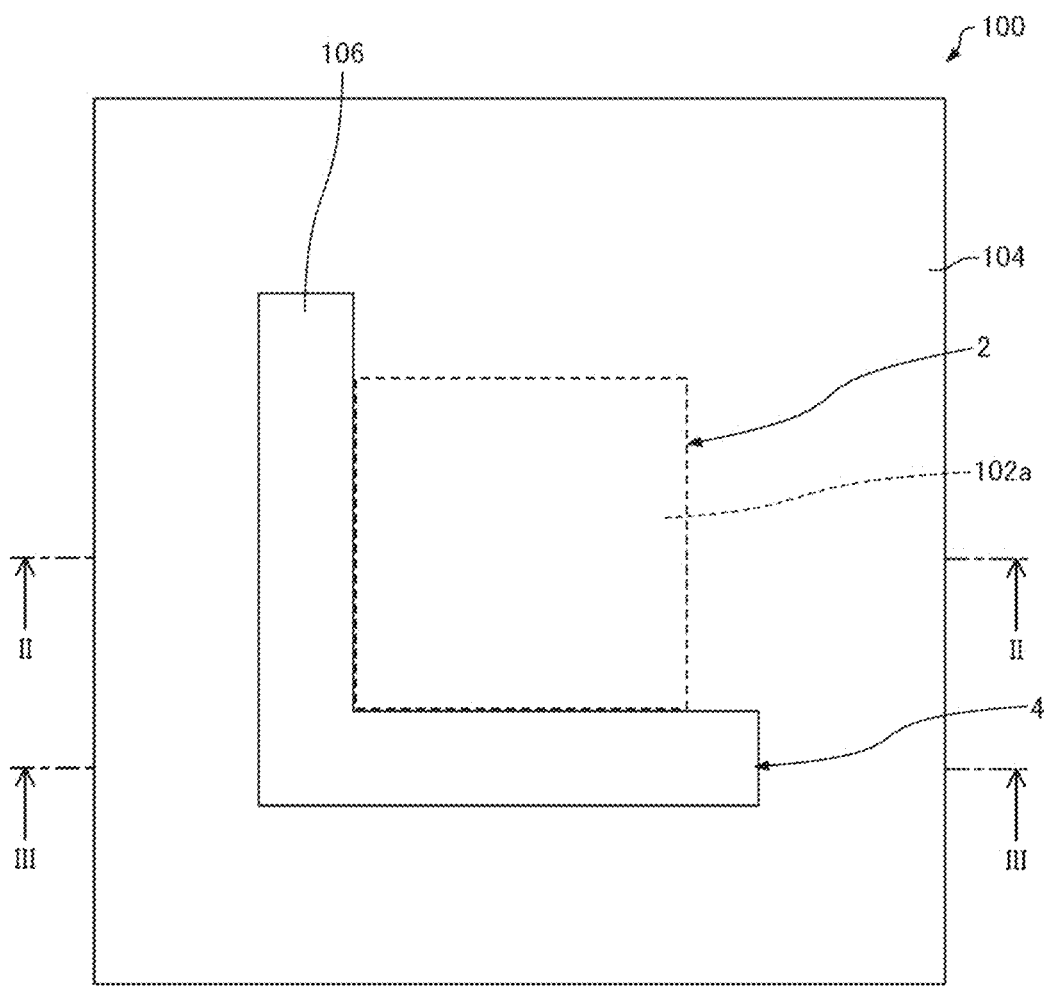
FIG. 1 is a schematic plan view of a sample support associated with a first embodiment of the present invention.
Figure 2:
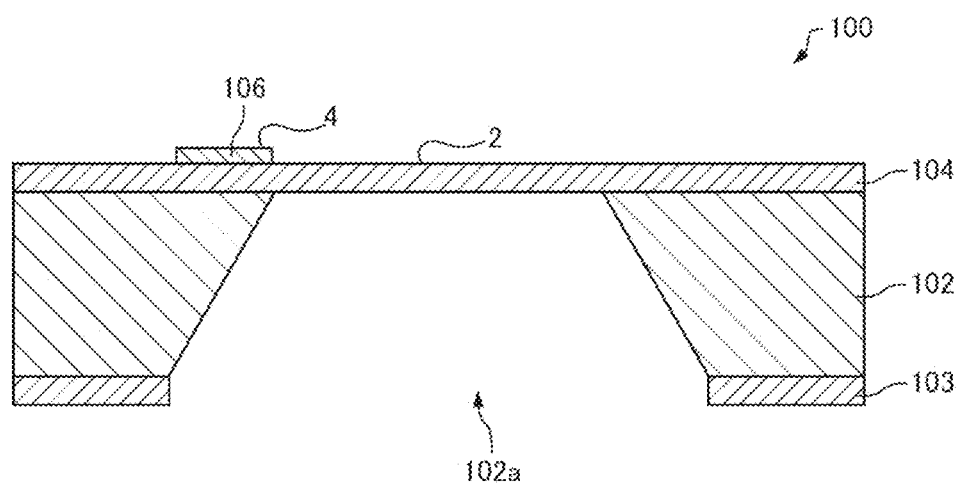
FIGS. 2 and 3 are schematic cross-sectional views of the sample support shown in FIG. 1, taken on different lines of FIG. 1.
Figure 3:
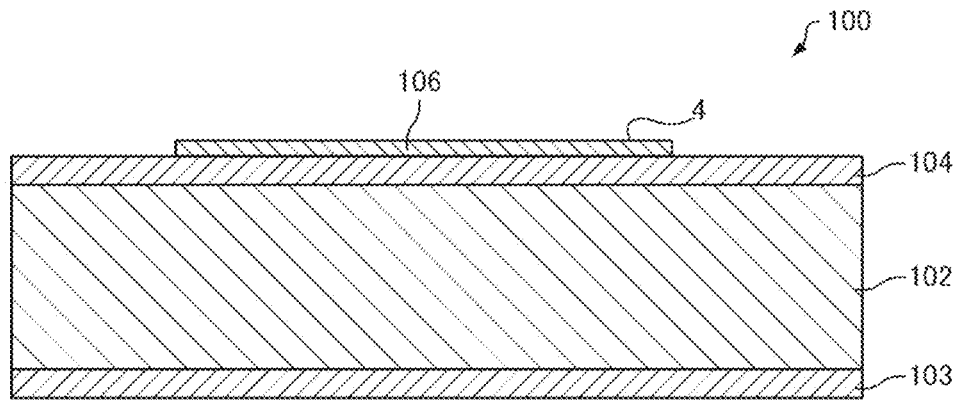
Figure 4:
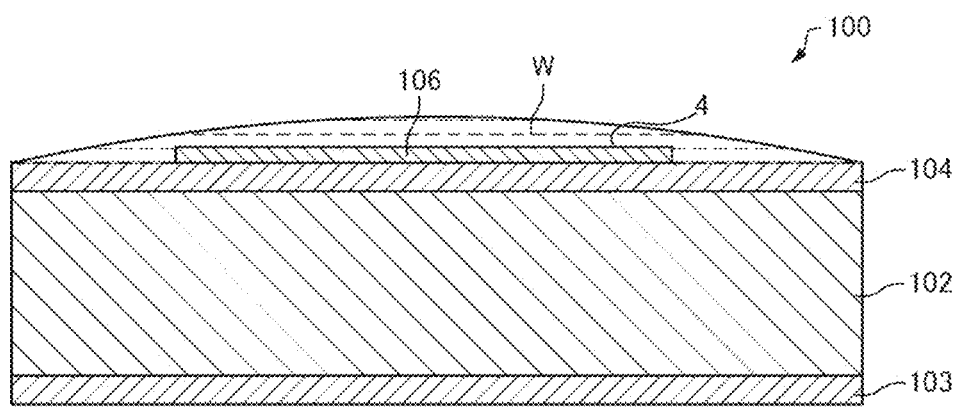
FIGS. 4-7 are sequential schematic cross-sectional views illustrating the manner in which water dries on the sample support shown in FIGS. 1-3.

A sample support associated with a first embodiment of the present invention is first described by referring to some drawing figures. FIG. 1 is a schematic plan view of the sample support, 100, associated with the first embodiment. FIGS. 2 and 3 are schematic cross-sectional views of the sample support 100. FIG. 2 is a cross-sectional view taken on line II-II of FIG. 1. FIG. 3 is a cross-sectional view taken on line III-III of FIG. 1.

The sample support 100 can provide mechanical support to an electron microscope sample. Where a TEM (transmission electron microscopy) sample is prepared, for example, using an ultramicrotome, the sample support 100 is used to scoop ultrafoil sections of the sample floating on the surface of wafer after cut with a diamond knife and to hold the sections. In this case, the ultrafoil sections cut with a diamond knife are chained together like one piece of ribbon. That is, they may form a continuous ultrafoil section which can be supported by the sample support 100. The sample support 100 can be attached to a TEM sample holder, for example, via retainers or the like.

As shown in FIGS. 1-3, the sample support 100 includes a baseplate 102, a sample support film 104, and a metal film 106. For example, the baseplate 102 is a silicon substrate. Various types of bases or substrates such as ceramic base or substrate, glass base or substrate, sapphire base or substrate, and synthetic resin base or substrate can be used as the baseplate 102. The baseplate 102 has a thickness ranging, for example, from 100 µm to 200 µm. The baseplate 102 is provided with a through hole 102a and has a rectangular, for example, planar form as viewed in the direction of the thickness of the baseplate 102. A mask layer 103 serving as a mask when the through hole 102 is formed is built up on the surface of the baseplate 102 on the opposite side of the sample support film 104.

The sample support film 104 is formed on and supported by the baseplate 102. The sample support film 104 is made, for example, of silicon nitride (SiN). Alternatively, The sample support film 104 may be made of silicon oxide (SiO$_2$) or carbon. The sample support film 104 has a thickness, for example, on the order of tens of nm. The sample support film 104 has a region on the through hole 102a and another region on the baseplate 102.

The sample support film 104 has a top surface on which the metal film 106 is formed, the film 106 lying over the baseplate 102. The metal film 106 is made by laminating chromium and gold in turn, for example, from the side of the baseplate 102. The metal film 106 may be made of other metals. For example, the metal film 106 may be made of a precious metal. The metal film 106 has a thickness, for example, of tens of nm to hundreds of nm. By using a precious metal film as the metal film 106, oxidation and corrosion of the surface of the metal film 106 can be reduced.

The sample support 100 has a first region 2 and a second region 4. The first region 2 is so designed that a sample is placed thereon. The first region 2 is constituted by the top surface of the sample support film 104. The first region 2 being the top surface of the sample support film 104 overlaps the through hole 102a as viewed within a plane, i.e., as viewed perpendicularly to the top surface of the sample support film 104. The first region 2 is a polygon in shape, for example, and is a rectangle in the example shown in FIG. 1. The length of each one side of the first region 2 is hundreds of micrometers to several micrometers, for example. Note that no restriction is imposed on the shape of the first region 2. Because the sample is placed on the first region 2, the electron beam impinging on the sample within the transmission electron microscope is transmitted through both the sample and the sample support film 104 and then detected by a detector.

The second region 4 is higher in wettability than the first region 2. That is, the second region 4 is higher in affinity to liquids than the first region 2. The second region 4 is constituted by the top surface of the metal film 106. As shown in FIG. 1, the second region 4 is formed along two sides of the polygonal first region 2. In the example shown in FIG. 1, the first region 2 is rectangular, and the second region 4 is formed along the two adjacent sides of the rectangular first region 2. That is, the second region 4 has an L-shaped form. The first region 2 and the second region 4 abut one another.

The sample support 100 is hydrophilized, for example, before ultrafoil sections floating on the surface of water are scooped. The hydrophilization is carried out, for example, using a hydrophilization treatment apparatus or the like that improves the hydrophilicity of the surface by a plasma treatment. Even if such a hydrophilization is performed, the second region 4 is still higher in wettability than the first region 2.

Figure 5:
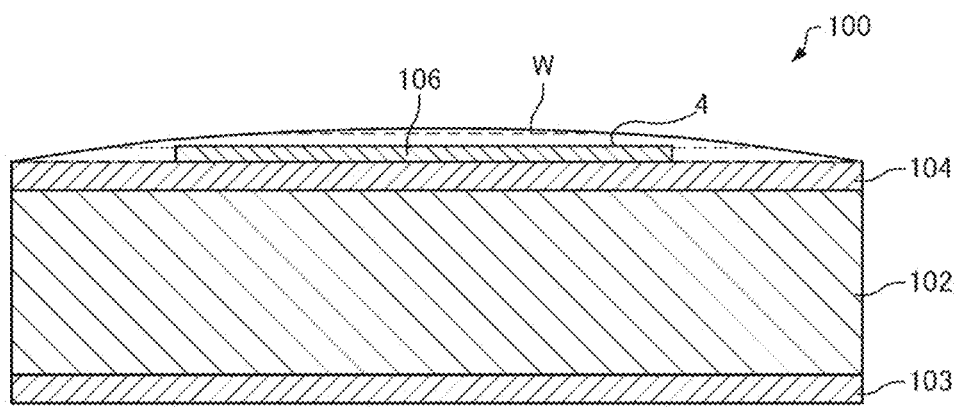
Figure 6:
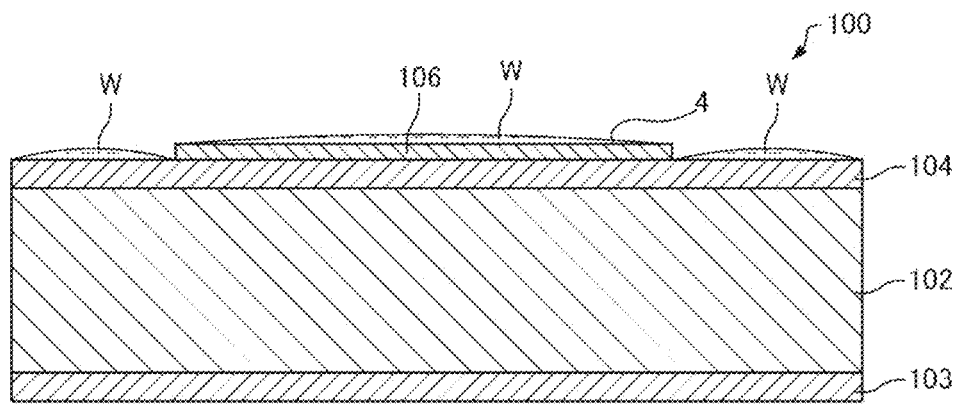
Figure 7:
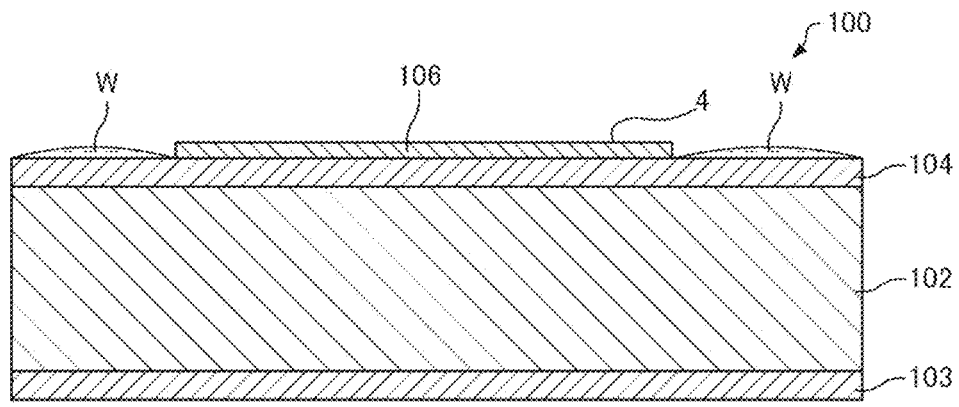

FIGS. 4-7 corresponding to FIG. 3 schematically illustrate the manner in which water dries on the sample support 100. In the state shown in FIG. 4, the top surface of the sample support 100 is wet with water W. Then, as the water W dries as shown in FIGS. 5 and 6, the amount of water W on the sample support 100 decreases. If the water W dries further and the second region 4 is exposed partially, the remaining water W on the second region 4 disappears momentarily as shown in FIG. 7. However, the water W is left on the sample support film 104 for the following reason. The amount of spreading water W that wets the second region 4 of higher wettability (i.e., of smaller contact angle) is small, while a larger amount of water is stably held on the region lying on the sample support film 104 of lower wettability (i.e., of greater contact angle).

In this way, in the sample support 100, as the drying progresses, the water W on the second region 4 disappears, but the water W remains on the first region 2. Therefore, where ultrafoil sections floating on the surface of water are scooped with the sample support 100, the water W on the second region 4 disappears earlier than the water on the first region 2. Consequently, the ultrafoil sections are guided to the first region 2. If the drying proceeds further, the water W on the first region 2 disappears with the result that the ultrafoil sections are put on the first region 2.

Figure 8:
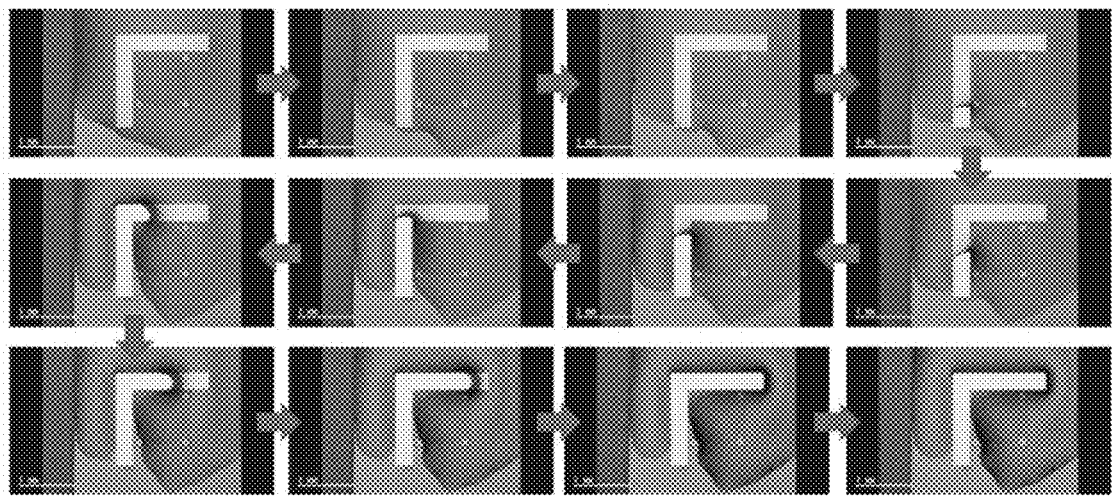
FIG. 8 is a sequence of photographs illustrating the manner in which water dries on the sample support shown in FIGS. 1-7.

FIG. 8 is a sequence of photographs illustrating the manner in which water dries on the sample support. With respect to the sample support shown in FIG. 8, the baseplate 102 is a silicon substrate. The sample support film 104 is an SiN film. The metal film 106 is a laminate film formed by stacking chromium and gold in turn from the baseplate (102) side. The sample support has been hydrophilized with an Electron Microscopic Hydrophilic Processor DII-29020HD, manufactured by JEOL Ltd.

As shown in FIG. 8, drying proceeds from the state where water wets and spreads over the metal film and the SiN film.

If the edge of the water film reaches the top surface of the metal film, the water on the metal film is drained off and disappears. Eventually, water is left only on the SiN film. The sample support 100 has the following advantageous effects.

The sample support 100 has the first region 2 on which a sample is to be placed and the second region 4 that is higher in wettability than the first region 2. As described previously, on the sample support 100, the water on the second region 4 disappears earlier and thus water is left on the first region 2. Therefore, when a TEM sample is prepared using an ultramicrotome, if ultrafoil sections floating on the water surface are scooped with the sample support 100, the sections are guided to and put on the first region 2. In this way, since the sample support 100 has the first region 2 and the second region 4, when a sample floating on the surface of water is scooped and held, the sample can be easily placed into position.

For example, where ultrafoil sections in a continuous ribbon-like form and floating on the water surface are supported by the sample support, it is desirable that the sections assume a linear form. With the sample support 100, movement of the sample can be controlled by means of the first region 2 and the second region 4. Therefore, the ultrafoil sections in a continuous ribbon-like form can easily be arranged linearly.

In the sample support 100, the first region 2 is a polygon in shape, while the second region 4 is formed along two sides of the polygon. Therefore, when the ultrafoil sections floating on the water surface are scooped with the sample support 100, the sections can be guided to the first region 2.

The sample support 100 includes the baseplate 102, the sample support film 104 supported by the baseplate 102, and the metal film 106 formed on the sample support film 104. The sample support film 104 has a top surface that constitutes the first region 2. The metal film 106 has a top surface that constitutes the second region 4. Therefore, when ultrafoil sections floating on the surface of water are scooped with the sample support 100, the sections can be guided to the first region 2.

In the sample support 100, the baseplate 102 is provided with the through hole 102a. The first region 2 is in registry with the through hole 102a. Therefore, the sample support 100 can be used as a TEM sample support.

In the sample support 100, the sample support film 104 is made of an SiN film, an $SiO_2$ film, or a carbon film. Therefore, if a sample is placed on the sample support film 104, the effects of the sample support film 104 on the resulting TEM image can be reduced.

1.2. Method of Fabricating Sample Support

Figure 9:
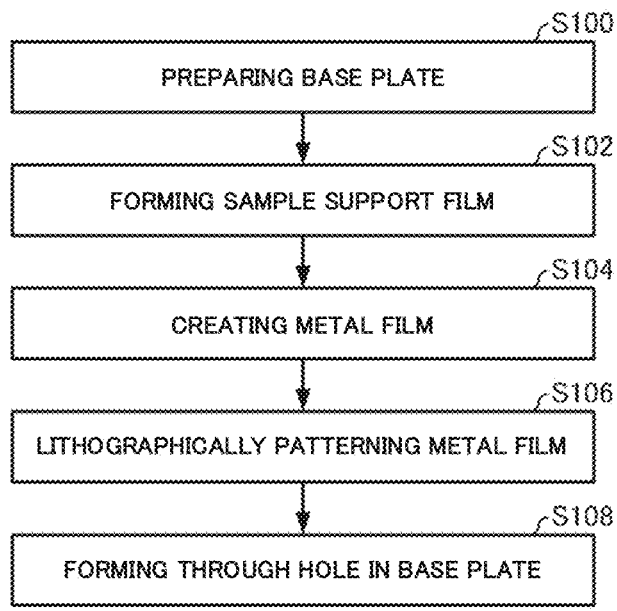
FIG. 9 is a flowchart illustrating one example of the method associated with the first embodiment to fabricate a sample support.
Figure 10:
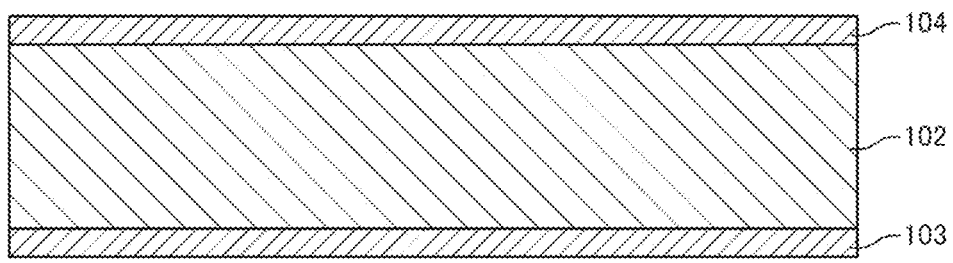
FIGS. 10-12 are schematic cross-sectional views illustrating steps of the method associated with the first embodiment to fabricate a sample support.
Figure 11:
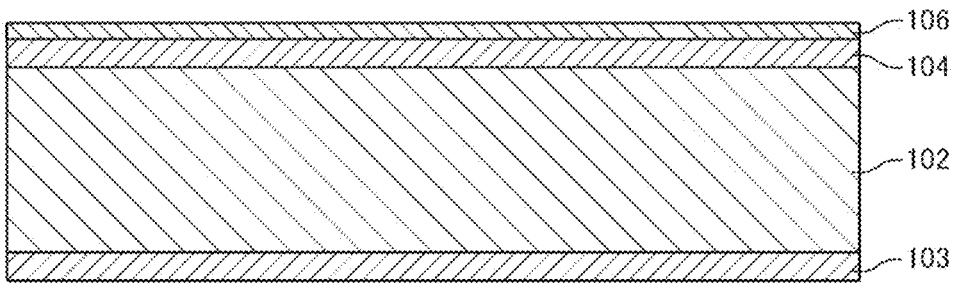
Figure 12:
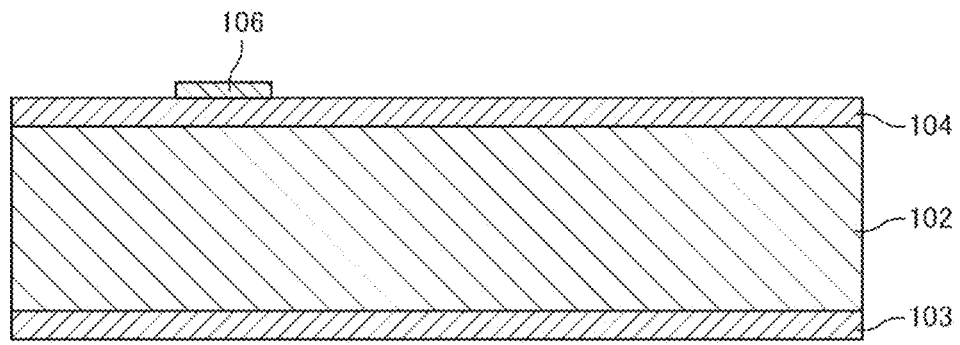
Figure 13:
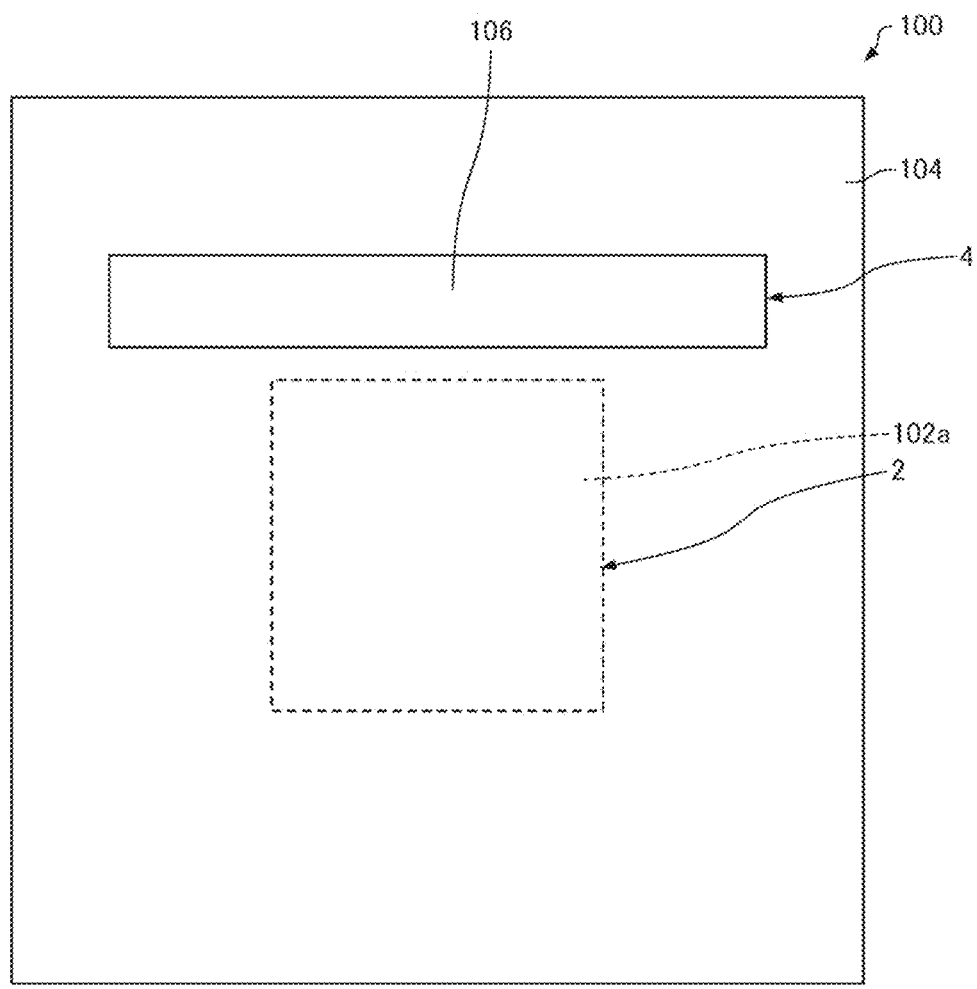
FIGS. 13-17 are schematic plan views of modifications of the sample support associated with the first embodiment of the present invention.
Figure 14:
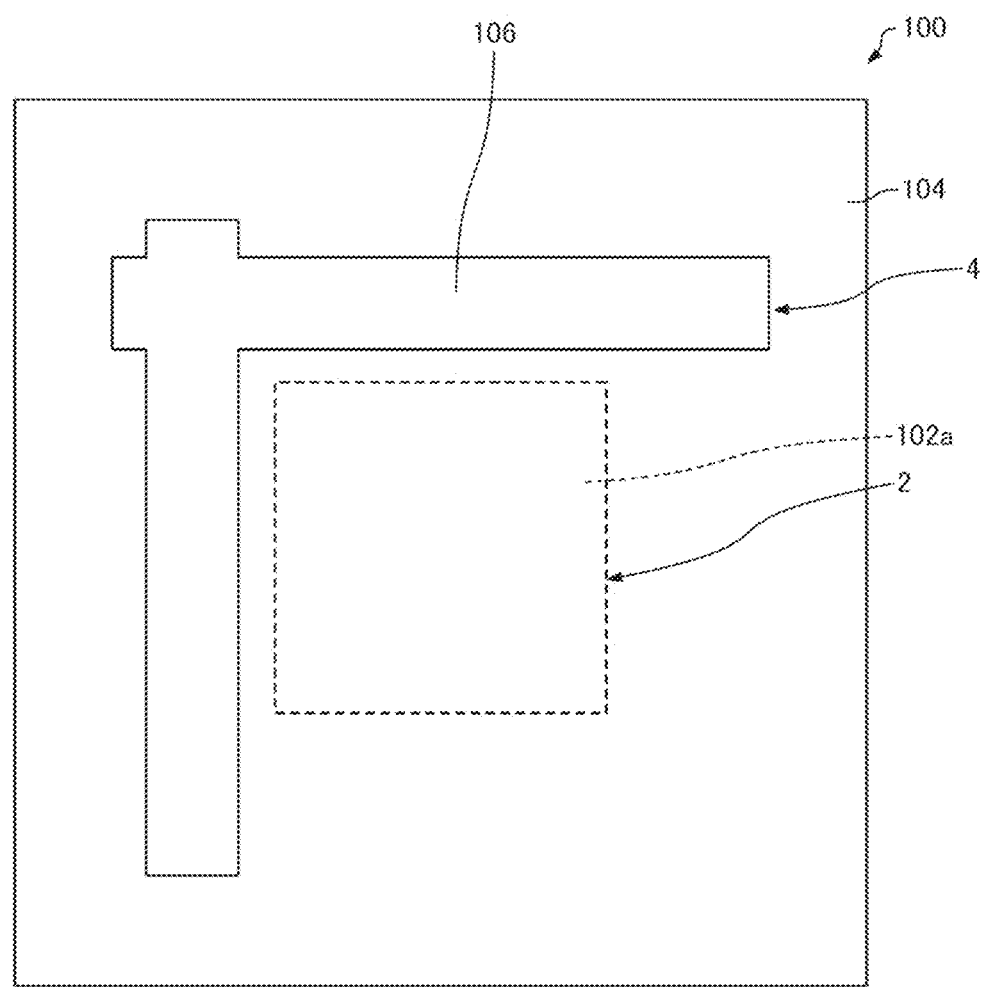

FIG. 9 is a flowchart illustrating one example of the method of fabricating the sample support 100. FIGS. 10-12 are schematic cross-sectional views of the steps of the method of fabricating the sample support 100.

First, as shown in FIG. 10, the baseplate 102 is prepared (S100). Then, an SiN film is deposited on the top and bottom surfaces of the baseplate 102, whereby the sample support film 104 and the mask layer 103 are formed on the top surface and the bottom surface, respectively, of the baseplate 102 (S102).

The formation of the SiN film is carried out by a physical vapor deposition technique (such as vacuum evaporation or sputtering) or a chemical vapor deposition (CVD) technique. The internal stress in the SiN film can be made tensile by growing the SiN film by low pressure chemical vapor deposition (LP-CVD). As a result, the first region 2 of large area can be formed.

Where a carbon film is used as the sample support film 104, the carbon film is created, for example, by vacuum evaporation or sputtering.

Then, as shown in FIG. 11, the metal film 106 is formed on the sample support film 104, for example, by a physical vapor deposition technique such as vacuum evaporation or sputtering (S104).

Then, as shown in FIG. 12, the metal film 106 is lithographically patterned (S106). A resist is applied on the metal film 106 and lithographically patterned to form a mask in a manner not illustrated. The lithography can be carried out using a laser lithography system, an electron beam lithography system, or the like, in which case the metal film 106 can be accurately patterned. Then, the metal film 106 is etched using the formed mask. Consequently, the metal film 106 can be patterned. The top surface of the metal film 106 constitutes the second region 4.

Then, as shown in FIG. 2, the baseplate 102 is etched from its bottom side to form the through hole 102a extending through the baseplate 102 (S108).

The through hole 102a can be formed, for example, by patterning the mask layer 103 and etching the baseplate 102 using the patterned mask layer 103 as a mask. The etching of the substrate 102 is done, for example, by a wet anisotropic etching process using potassium hydroxide, tetramethylammonium hydroxide, or the like. That portion of the top surface of the sample support film 104 which is in registry with the through hole 102a constitutes the first region 2. The sample support 100 can be fabricated by the processing steps described thus far.

1.3. Modifications

Modifications of the sample support 100 are next described. In the following description, only the differences with the above-described sample support 100 shown in FIGS. 1-3 are set forth; a description of similarities is omitted.

FIGS. 13-17 are schematic plan views of modifications of the sample support 100. In the example shown in FIG. 13, the first region 2 is rectangular in shape, and the second region 4 is formed along one side of the rectangle. The second region 4 is a rectangle elongated along the one side of the rectangular first region 2. In the example shown in FIG. 14, the second region 4 is L-shaped. The first region 2 and the second region 4 are spaced from each other.

Figure 15:
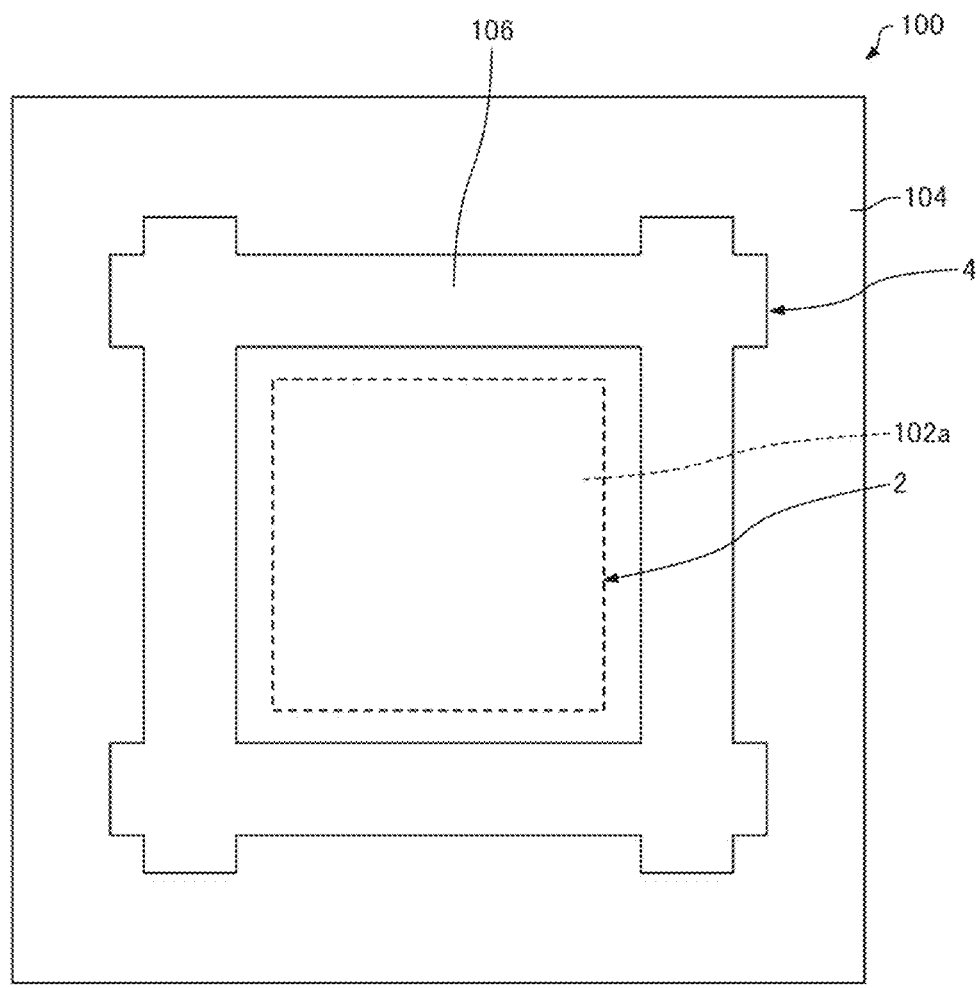

In the example shown in FIG. 15, the second region 4 surrounds the first region 2. Therefore, when a sample floating on the surface of water is scooped and held, the sample can be placed onto the first region 2 with greater certainty.

Figure 16:
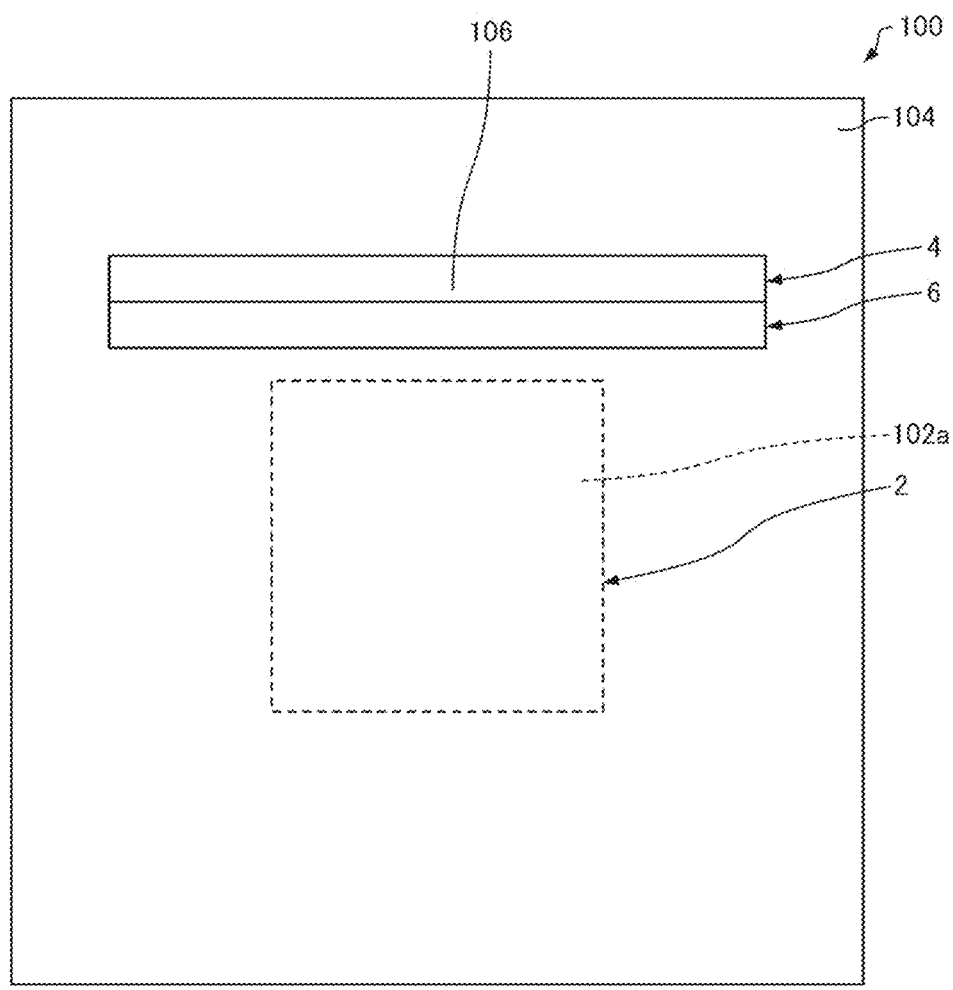

In the example shown in FIG. 16, the sample support 100 has the first region 2, the second region 4, and a third region 6 that is higher in wettability than the first region 2 and lower in wettability than the second region 4. The wettability of the third region 6 can be reduced by making this third region 6 different in surface condition (e.g., material or structure (such as microstructural morphology)), for example, from the second region 4.

The distance between the first region 2 and the third region 6 is less than the distance between the first region 2 and the second region 4. The third region 6 is located between the first region 2 and the second region 4.

In the example shown in FIG. 16, if ultrafoil sections floating on the surface of water are scooped with the sample support 100, the water on the second region 4 disappears earlier and then the water on the third region 6 disappears. Water remains on the first region 2. Therefore, if ultrafoil sections floating on the water surface are scooped with the sample support 100, the ultrafoil sections are guided to the first region 2 because the second region 4, third region 6, and first region 2 are emptied of water successively in this order. Because the water on the first region 2 dries, the sections are placed on the first region 2.

Figure 17:
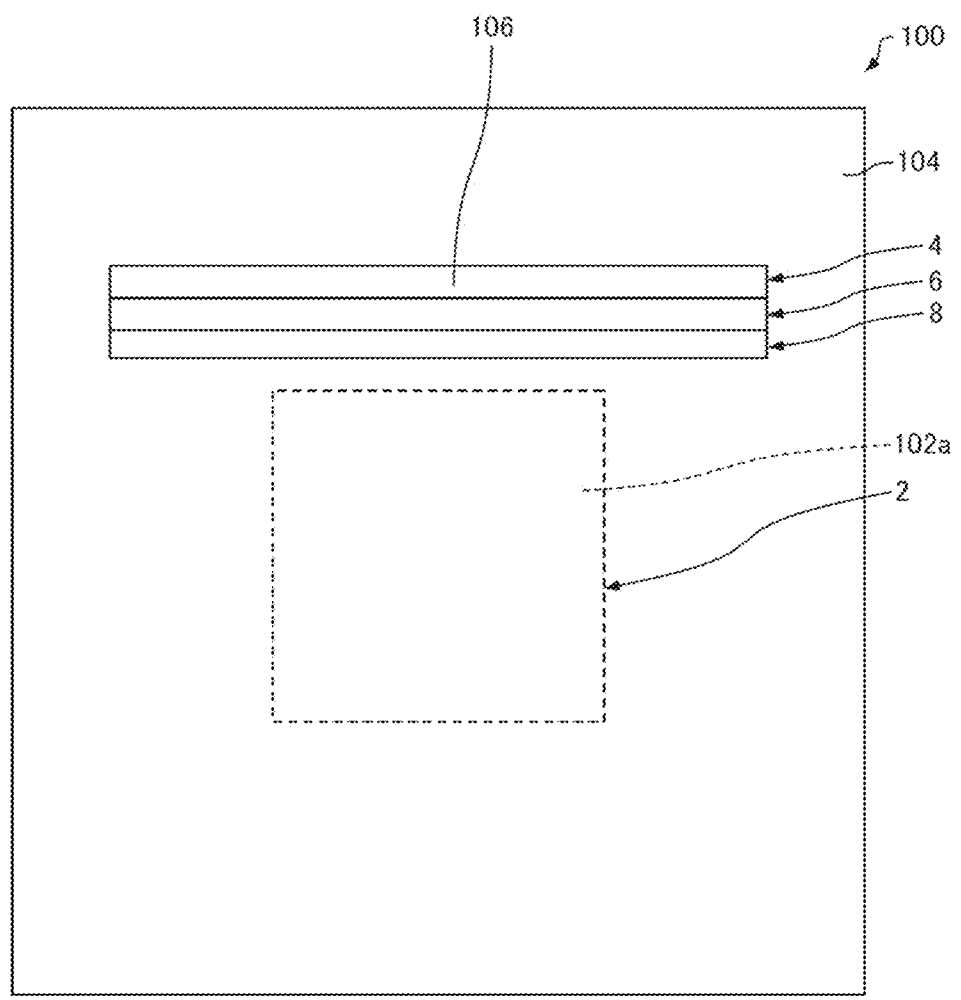

In the example shown in FIG. 17, the sample support 100 has first region 2, second region 4, third region 6, and fourth region 8. The fourth region 8 is higher in wettability than the first region 2 and lower in wettability than the third region 6. The distance between the fourth region 8 and the first region 2 is less than the distance between the third region 6 and the first region 2. The fourth region 8 is positioned between the first region 2 and the third region 6.

In the example shown in FIG. 17, if ultrafoil sections floating on the surface of water are scooped with the sample support 100, then the second region 4, third region 6, and fourth region 8 lose their water successively in this order, and the water remains on the first region 2. Therefore, if the floating sections are scooped with the sample support 100, the sections are guided to the first region 2 because the second region 4, third region 6, fourth region 8, and first region 2 lose their water successively in this order. Because the water on the first region 2 dries, the sections are placed on the first region 2.

By providing plural regions having different degrees of wettability in this way, when ultrafoil sections floating on the surface of water are scooped with the sample support 100, the sample can be guided into position.

2. Second Embodiment

2.1. Sample Support

Figure 18:
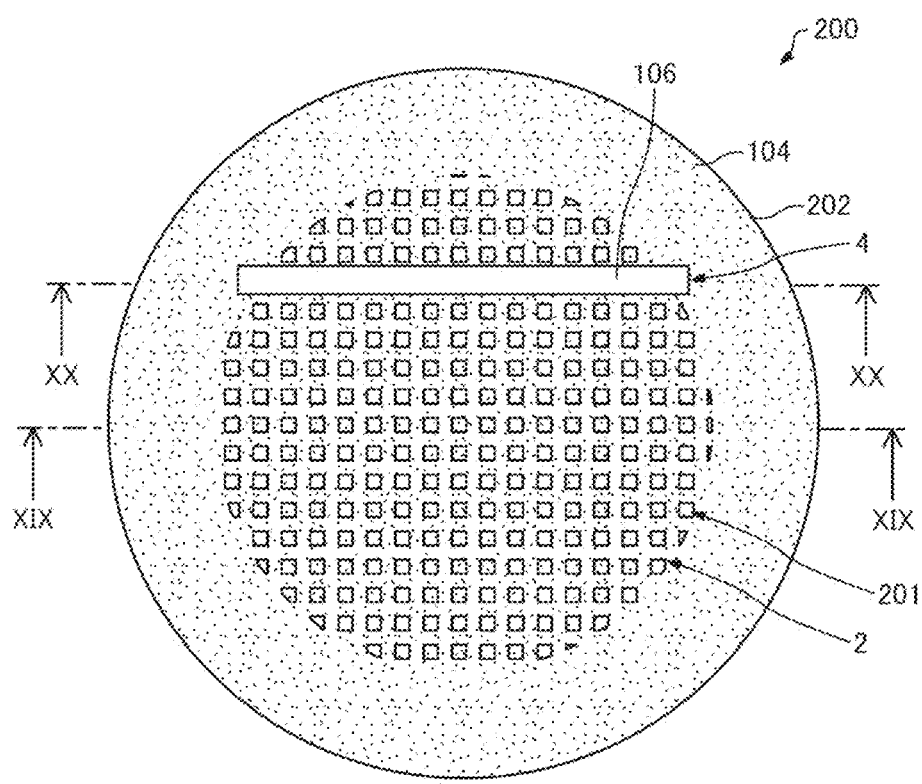
FIG. 18 is a schematic plan view of a sample support associated with a second embodiment.
Figure 19:
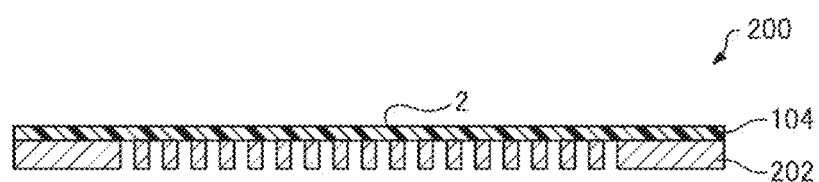
FIGS. 19 and 20 are schematic cross-sectional views of the sample support shown in FIG. 18.
Figure 20:
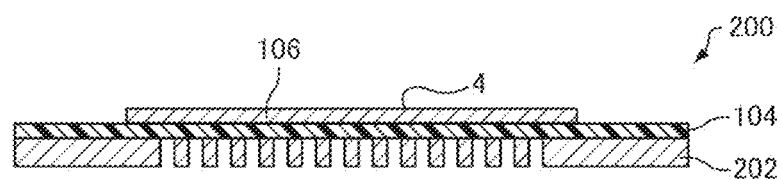

A sample support associated with a second embodiment is next described by referring to FIGS. 18-20. FIG. 18 is a schematic plan view of the sample support, 200, associated with the second embodiment. FIGS. 19 and 20 are schematic cross-sectional views of the sample support 200. FIG. 19 is a cross-sectional view taken on line XIX-XIX of FIG. 18. FIG. 20 is a cross-sectional view taken on line XX-XX of FIG. 18.

Those members of the sample support 200 associated with the second embodiment which are similar in function to their respective counterparts of the sample support 100 associated with the first embodiment are indicated below by the same reference numerals as in the foregoing figures and a detailed description thereof is omitted.

As shown in FIGS. 18-20, the sample support 200 includes a sample grid 202 for TEM, a sample support film 104, and a metal film 106. The sample grid 202 has a meshed region 201 in which holes of a diameter on the order of micrometers to tens of micrometers are arranged at regular intervals. The material of the sample grid 202 is a metal such as copper, molybdenum, stainless steel, or platinum. The thickness of the sample grid 202 is, for example, on the order of from 10 μm to 100 μm.

The sample support film 104 is formed over the whole top surface of the sample grid 202 and provides a cover over the openings of the holes in the sample grid 202. The sample support film 104 is made, for example, of collodion, formvar, carbon, germanium, amorphous silicon, or the like.

The metal film 106 is formed on the sample support film 104 so as to overlap with the meshed region 201. The metal film 106 is made of a noble metal such as gold.

The sample support 200 has a first region 2 and a second region 4. The sample support film 104 has a top surface that constitutes the first region 2. The first region 2 being the top surface of the sample support film 104 overlaps with the meshed region 201 as viewed within a plane. Because the sample is placed on the first region 2, an electron beam directed at the sample within a transmission electron microscope is transmitted through the sample and the sample support film 104 and then detected by a detector.

The second region 4 is higher in wettability than the first region 2 and constituted by the top surface of the metal film 106. The shape of the second region 4, i.e., planar geometry, is a rectangle in the example shown in FIG. 18. The second region 4 of the sample support 200 may be similar in configuration with the second region 4 of the sample support 100 already shown in FIGS. 1 and 14-17.

Because the sample support 200 has the first region 2 on which a sample is to be placed and the second region 4 of higher wettability than the first region 2, when a sample floating on the surface of water is scooped and held, the sample can be easily placed into position in the same manner as for the sample support 100.

2.2. Method of Fabricating Sample Support

Figure 21:
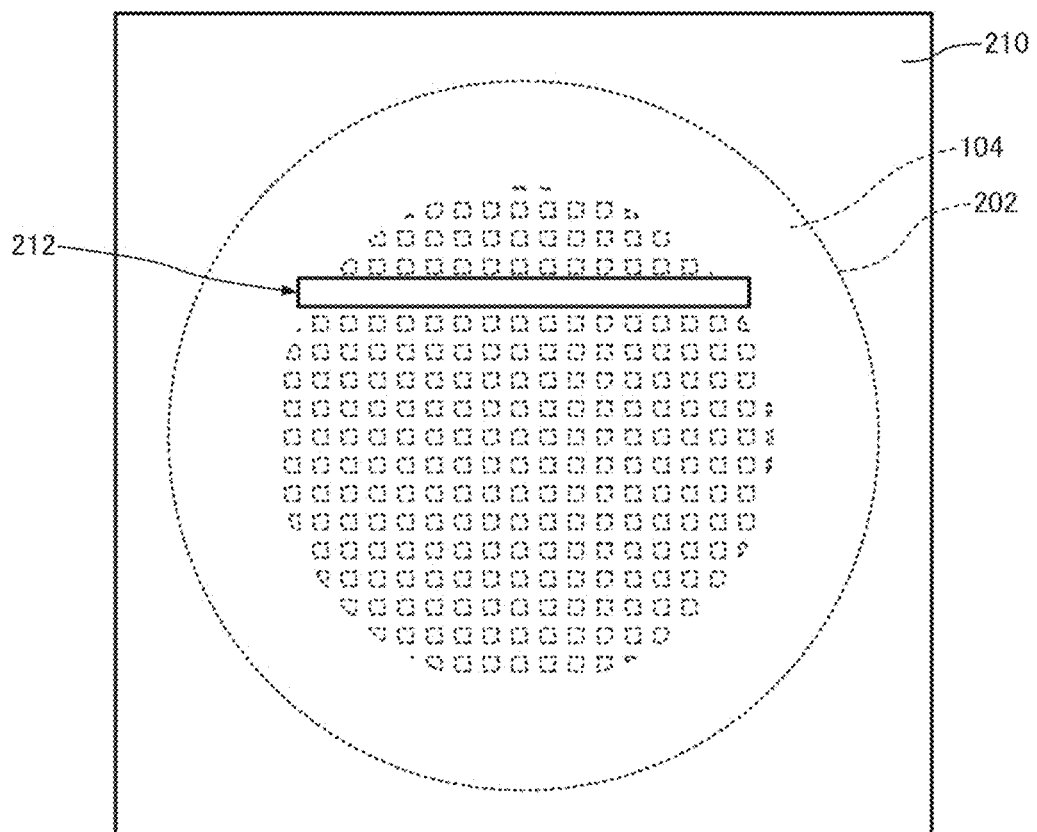
FIG. 21 is a schematic plan view illustrating one step of the method associated with the second embodiment for fabricating the sample support of FIGS. 19 and 20.

FIG. 21 is a schematic plan view illustrating manufacturing steps for the sample support 200. As shown in FIG. 21, a stencil mask 210 having a through hole 212 of the same shape as the second region 4 is placed on the sample grid 202 having the sample support film 104 formed thereon. Then, a metal is deposited on the sample support film 104 by physical vapor deposition through the stencil mask 210. Consequently, as shown in FIG. 20, the metal film 106 is formed on the sample support film 104. The sample support 200 can be fabricated by the processing steps described so far.

3. Third Embodiment

3.1. Sample Support

Figure 22:
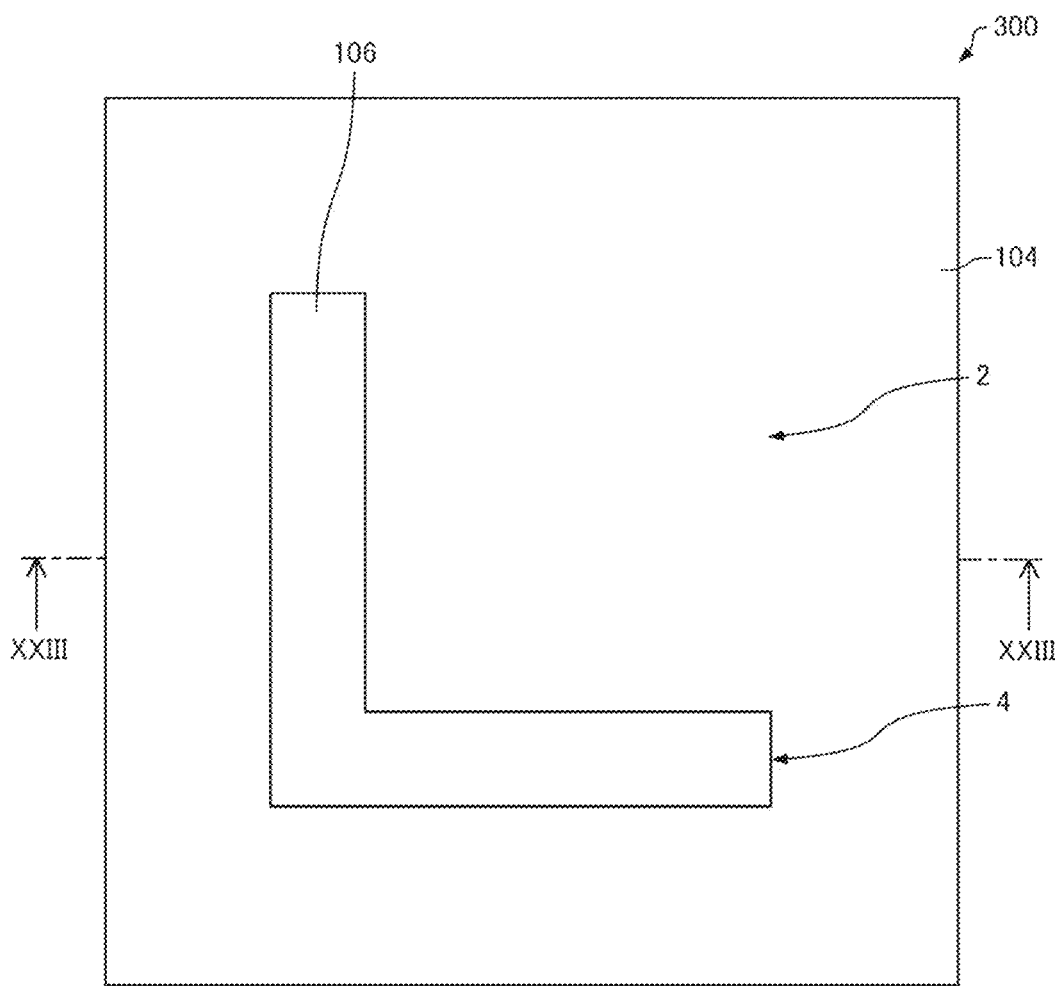
FIG. 22 is a schematic plan view of a sample support associated with a third embodiment.
Figure 23:
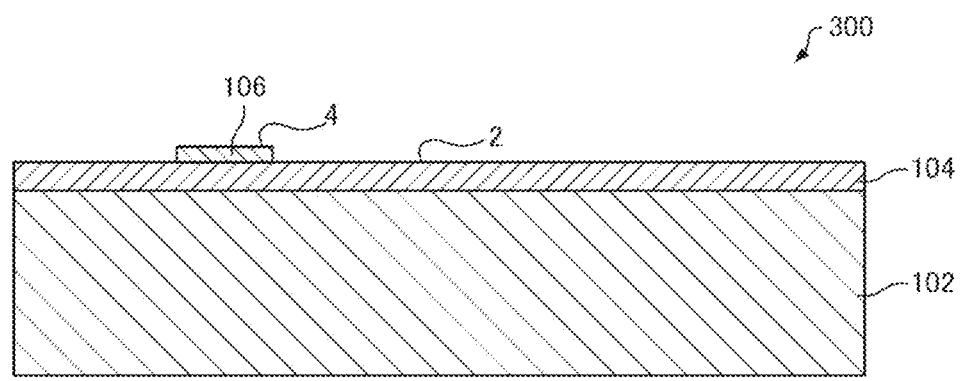
FIG. 23 is a schematic cross-sectional view of the sample support shown in FIG. 22.

A sample support associated with a third embodiment is next described by referring to FIGS. 22-23. FIG. 22 is a schematic plan view of the sample support, 300, associated with the third embodiment. FIG. 23 is a schematic plan view of the sample support 300. FIG. 23 is a cross-sectional view taken on line XXIII-XXIII of FIG. 22. Those members of the sample support 300 which are similar in function to their respective counterparts of the sample support 100 associated with the first embodiment are indicated below by the same reference numerals as in the foregoing figures and a detailed description thereof is omitted.

The above-described sample support 100 shown in FIGS. 1-3 is used to support a TEM sample. The sample support 300 shown in FIGS. 22 and 23 is used to mechanically support an SEM (scanning electron microscopy) sample.

Where an SEM sample is prepared, for example, using an ultramicrotome, the sample support 300 is used to scoop and hold ultrafoil sections floating on the surface of water after being cut with a diamond knife. The sample support 300 can also support ultrafoil sections in a continuous ribbon-like form, for example.

In the sample support 300, the baseplate 102 is in the form of a flat board or plate and has no through hole. The sample support film 104 is made, for example, of SiN or $SiO_2$. For example, the sample support film 104 may be made of ITO (indium tin oxide), in which case static electrification can be reduced during SEM imaging.

The sample support 300 has the first region 2 and the second region 4. The sample support film 104 has a top surface that constitutes the first region 2. The metal film 106 has a top surface that constitutes the second region 4.

The sample support 300 can yield advantageous effects similar to those provided by the sample support 100. Furthermore, the sample support 300 can mechanically support SEM samples.

3.2. Method of Fabricating Sample Support

The method of fabricating the sample support 300 is similar to the method of fabricating the sample support 100 except that the through hole 102a is not formed in the baseplate 102 and so a description thereof is omitted.

3.3. Modification

A modification of the sample support 300 is next described. In the following description, only the differences with the sample support 300 already described in connection with FIGS. 22 and 23 are set forth; a description of similarities is omitted.

Figure 24:
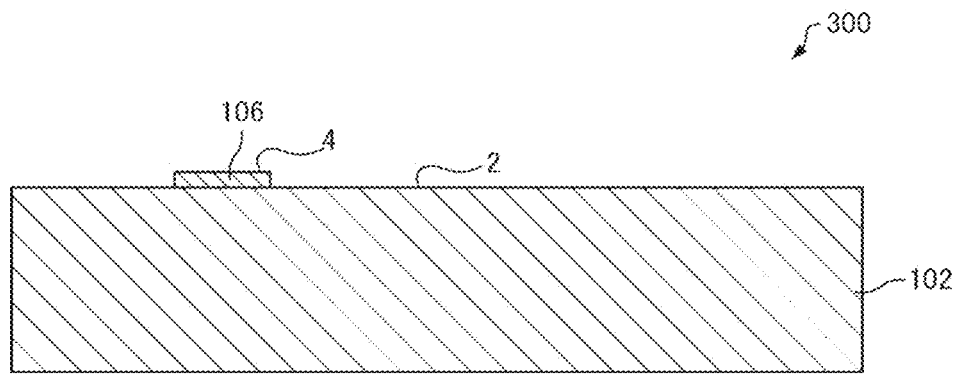
FIG. 24 is a schematic cross-sectional view of a modification of the sample support shown in FIG. 23.

FIG. 24 is a schematic cross-sectional view of the modification of the sample support 300. The sample support 300 does not need to have the sample support film 104 as shown in FIG. 24.

The baseplate 102 is electrically conductive, and is a silicon substrate, for example. The metal film 106 is formed on the top surface of the baseplate 102.

The metal film 106 can be formed, for example, by depositing a metal layer and patterning it by photolithography or other technique. Alternatively, the metal film 106 may be formed on the baseplate 102 by placing a stencil mask on the baseplate 102 and depositing a metal as a film by physical vapor deposition or the like through the stencil mask.

In the sample support 300, the first region 2 is constituted by the top surface of the baseplate 102, while the second region 4 is constituted by the top surface of the metal film 106 formed on the baseplate 102. In the sample support 300, the metal film 106 is directly deposited on the electrically conductive baseplate 102 and so static electrification can be reduced during SEM imaging, for example, as compared with the case where there is the sample support film 104 that is electrically insulative.

4. Fourth Embodiment 4.1. Sample Support

Figure 25:
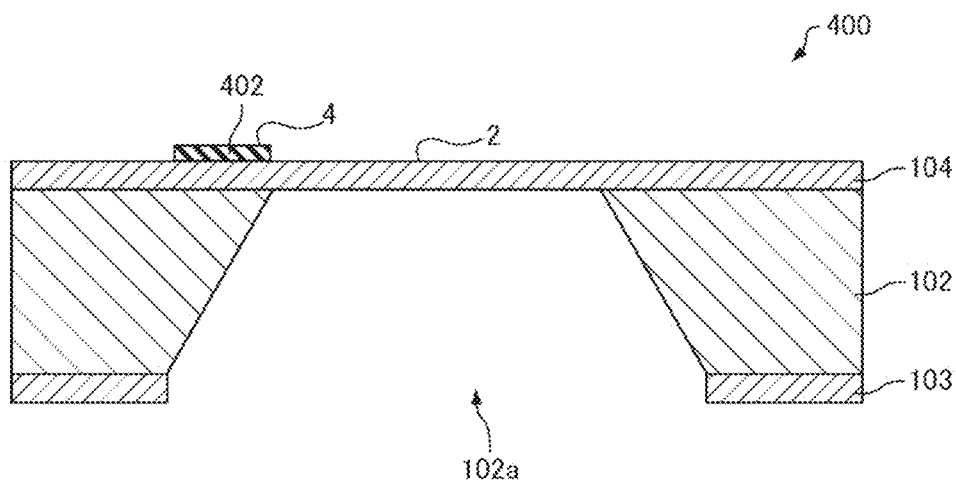
FIG. 25 is a schematic cross-sectional view of a sample support associated with a fourth embodiment.

A sample support associated with a fourth embodiment is next described by referring to FIG. 25, which is a schematic cross-sectional view of the sample support, 400, associated with the fourth embodiment. FIG. 25 corresponds to FIG. 2. Those members of the sample support 400 which are similar in function with their respective counterparts of the sample support 100 associated with the first embodiment are indicated below by the same reference numerals as in the above-referenced FIG. 2 and a detailed description thereof is omitted.

In the above-described sample support 100, the second region 4 of higher wettability is constituted by the top surface of the metal film 106. On the other hand, in the sample support 400, the second region 4 of higher wettability is made of a surface-active agent 402.

The surface-active agent 402 is applied on the top surface of the sample support film 104. For example, Triton X-100 can be used as the surface-active agent 402. No restriction is imposed on the type of the surface-active agent 402 as long as the wettability of the sample support film 104 can be enhanced. The second region 4 is constituted by the top surface of the surface-active agent 402.

The second region 4 of the sample support 400 is similar in shape to the second region 4 of the above-described sample support 100 shown in FIG. 1. Alternatively, the second region 4 of the sample support 400 may be similar in shape to the above-described second region 4 of the sample support 100 shown in FIGS. 13-17.

In the sample support 400, the second region 4 is constituted by the top surface of the surface-active agent 402. The sample support 400 can yield advantageous effects similar to those provided by the sample support 100.

4.2. Method of Fabricating Sample Support

Figure 26:
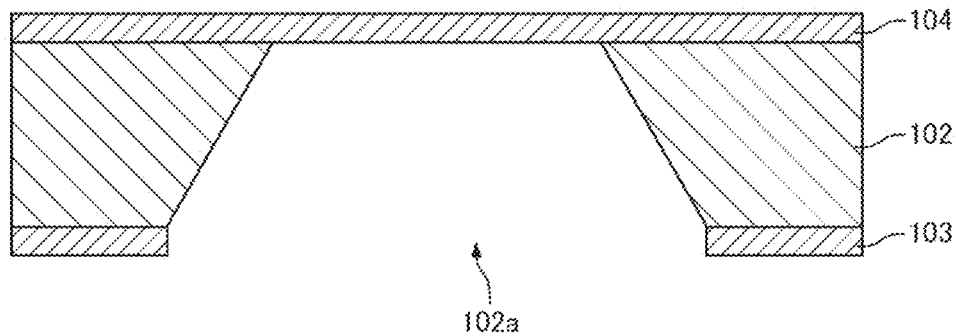
FIGS. 26-28 are schematic cross-sectional views illustrating steps of a method of fabricating the sample support shown in FIG. 25.
Figure 27:
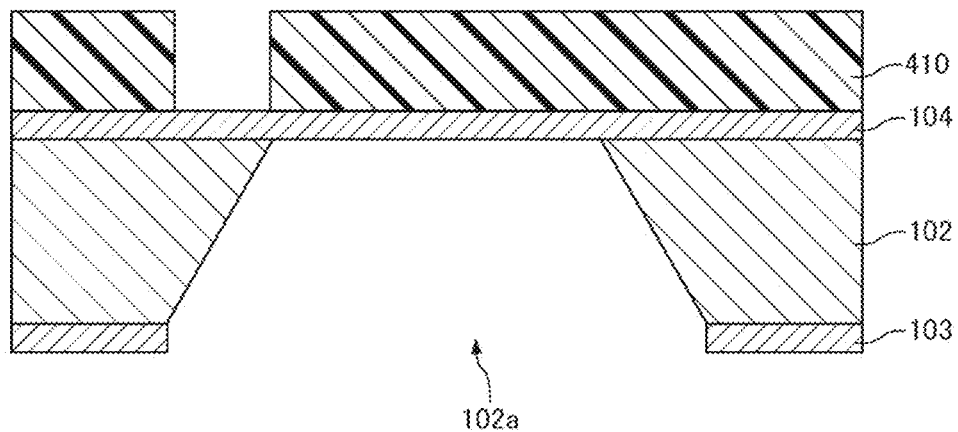
Figure 28:
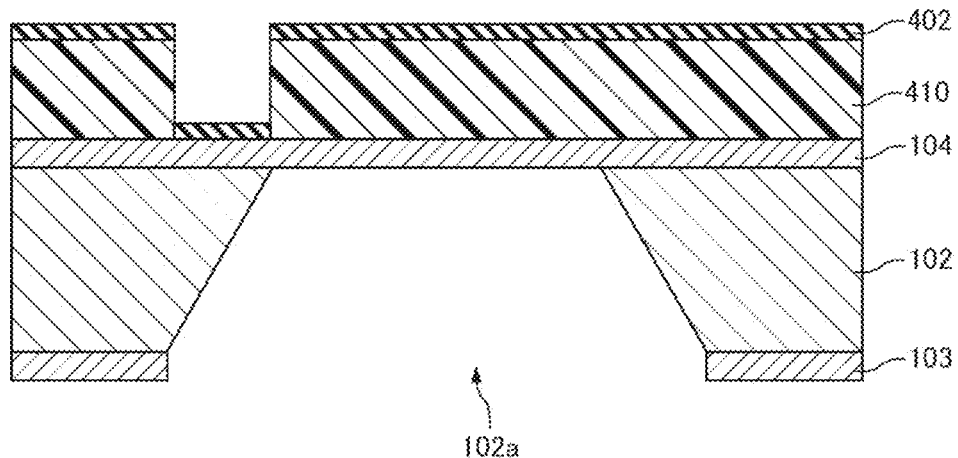

FIGS. 26-28 are schematic cross-sectional views illustrating manufacturing steps for the sample support 400. First, as shown in FIG. 26, the baseplate 102 is prepared, and the sample support film 104 is formed on the baseplate 102. Then, the through hole 102a is formed in the baseplate 102. The sample support film 104 is formed by a step similar to the step (S102) of forming the sample support film 104. The through hole 102a is formed by a step similar to the step (S108) of forming the through hole 102a in the baseplate 102.

Then, as shown in FIG. 27, a resist 410 is applied on the sample support film 104, for example, using a spin coater. The resist 410 is then patterned by photolithography or other technique.

Then, as shown in FIG. 28, the surface-active agent 402 is applied on the resist 410 and on the sample support film 104 using a spin coater or the like.

Then, as shown in FIG. 25, the resist 410 is removed. Consequently, a layer of surface-active agent 402 can be formed on the sample support film 104. As a result of the processing steps described so far, the sample support 400 can be fabricated.

The sample support 400 may also be fabricated by applying the surface-active agent 402 directly on the sample support film 104 shown in FIG. 26 using a cotton-tipped swab or the like.

5. Fifth Embodiment 5.1. Sample Support

Figure 29:
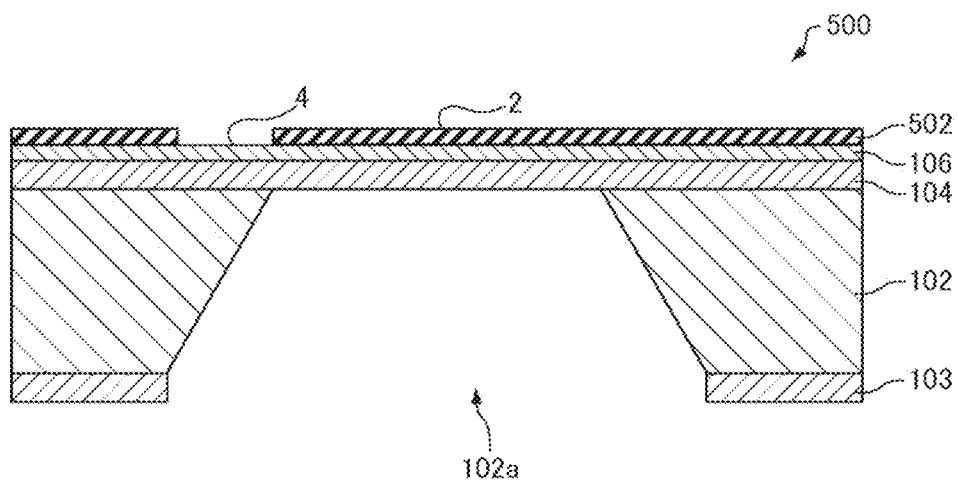
FIG. 29 is a schematic cross-sectional view of a sample support associated with a fifth embodiment.

A sample support associated with a fifth embodiment is next described by referring to FIG. 29, which is a schematic cross-sectional view of the sample support, 500, associated with the fifth embodiment. FIG. 29 corresponds to FIG. 2. Those members of the sample support 500 which are similar in function to their respective counterparts of the sample support 100 associated with the first embodiment are indicated below by the same reference numerals as in FIGS. 1-3 and a detailed description thereof is omitted.

In the sample support 500, the first region 2 is constituted by the top surface of a water-repellent film 502 made of a water-repellent material. The second film 4 is constituted by the top surface of the metal film 106.

In the sample support 500, the sample support film 104 is formed on the baseplate 102, and the metal film 106 is formed on the sample support film 104. The water-repellent film 502 is formed on the metal film 106. The water-repellent film 502 is made, for example, of a water-repellent polymer and provided with the through hole 102a that exposes the metal film 106. The region of the metal film 106 exposed by the through hole 102a is the second region 4.

The second region 4 of the sample support 500 is similar in shape to the second region 4 of the above-described sample support 100 shown in FIG. 1. Alternatively, the second region 4 of the sample support 500 may be similar in shape to the second region 4 of the sample support 100 shown in FIGS. 13-17.

In the sample support 500, the first region 2 is constituted by the top surface of the water-repellent film 502. The sample support 500 can yield advantageous effects similar to those provided by the sample support 100.

5.2. Method of Fabricating Sample Support

Figure 30:
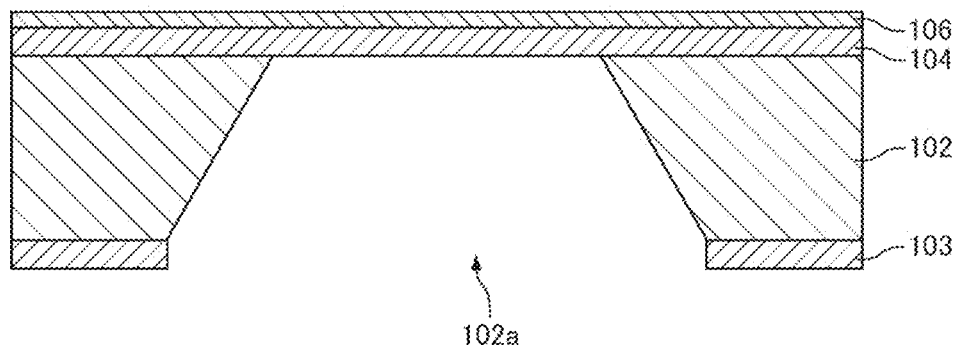
FIGS. 30-33 are schematic cross-sectional views illustrating steps of a method of fabricating the sample support shown in FIG. 29.

FIGS. 30-33 are schematic cross-sectional views illustrating manufacturing steps for the sample support 500. First, as shown in FIG. 30, the baseplate 102 is prepared, and the sample support film 104 is formed on the baseplate 102. The through hole 102a is then formed in the baseplate 102. The sample support film 104 is formed by a step similar to the above-described step (S102) of forming the sample support film 104. The through hole 102a is formed by a step similar to the above-described step (S108) of forming the through hole 102a in the baseplate 102. Then, the metal film 106 is formed on the sample support film 104.

Figure 31:
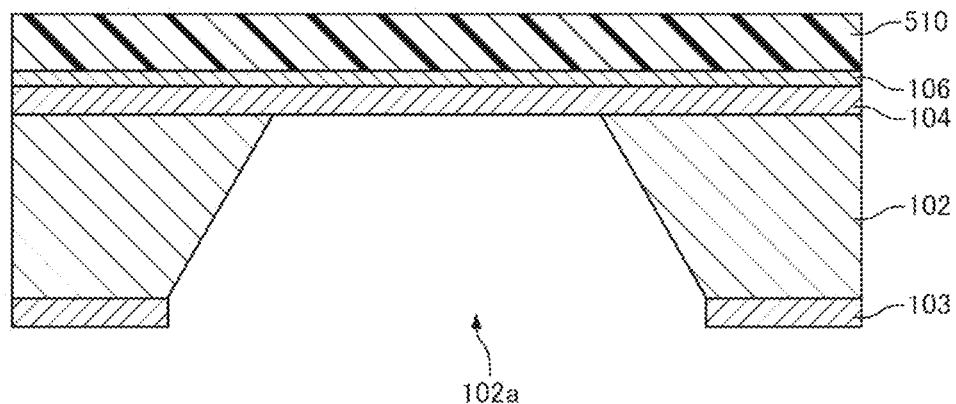
Figure 32:
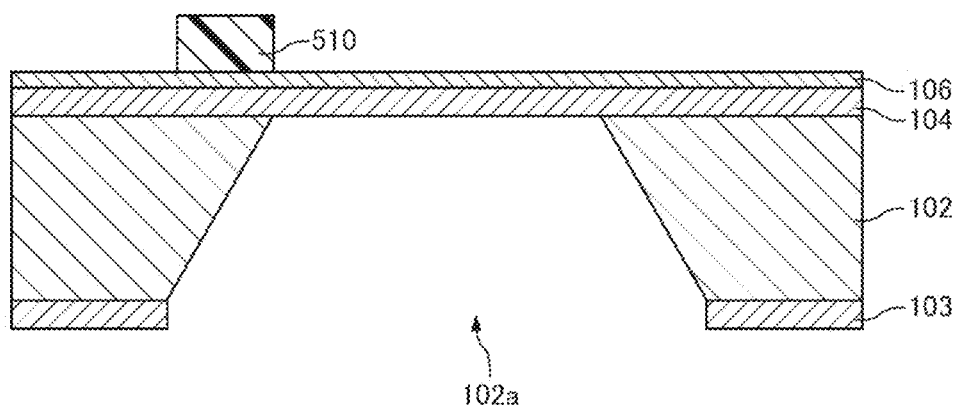

Then, as shown in FIG. 31, a resist 510 is applied on the metal film 106 using a spin coater or the like. The resist 510 is then patterned as shown in FIG. 32.

Figure 33:
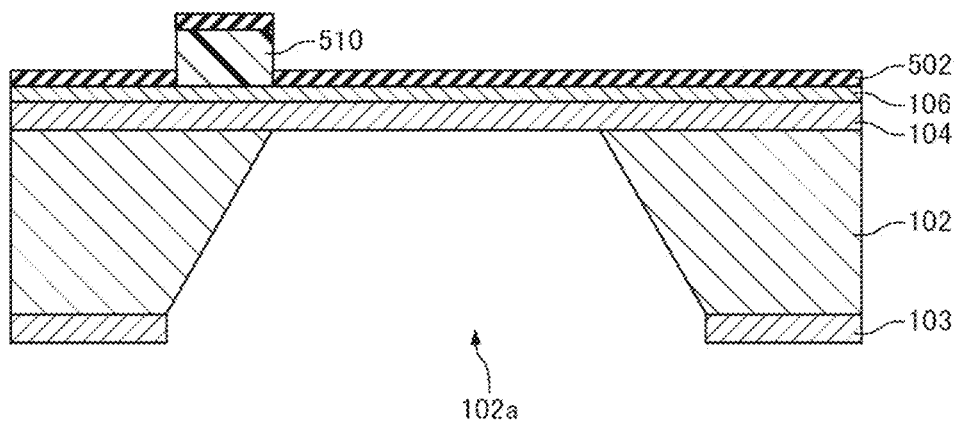

Then, as shown in FIG. 33, the water-repellent film 502 is formed on the metal film 106 and on the resist 510. Where a water-repellent polymer is used as the water-repellent film 502, the water-repellent film 502 is formed, for example, using a spin coater.

Then, as shown in FIG. 29, the resist 510 is peeled off, and the water-repellent film 502 on the resist 510 is removed. Consequently, the water-repellent film 502 is formed on the metal film 106, resulting in the first region 2 and the second region 4. Because of the processing steps described so far, the sample support 500 can be fabricated.

Alternatively, the sample support 500 may be fabricated by applying a water-repellent polymer directly on the sample support film 104 shown in FIG. 30 by the use of a cotton-tipped swab or the like. Also, the metal film 106 may be formed directly on the baseplate 102 without forming the sample support film 104 on the baseplate 102.

It is to be noted that the foregoing embodiments and modified embodiments are merely exemplary of the invention and that the invention is not restricted to them. For example, the various embodiments and modified embodiments can be combined appropriately.

The present invention is not restricted to the foregoing embodiments but rather can be implemented in various modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A sample support for holding a sample floating on the surface of water, said sample support comprising:
   a first region on which the sample is to be placed;
   a second region of higher wettability than the first region, such that the first region repels water more than the second region;
   a baseplate;
   a sample support film supported by the baseplate; and
   a metal film formed on the sample support film;
   wherein said sample support film and said metal film have top surfaces which constitute said first region and said second region, respectively;
   wherein said baseplate has a through hole; and
   wherein said first region is in registry with the through hole and said second region is not in registry with the through hole.

2. The sample support as set forth in claim 1, wherein said first region is a polygon in shape, and wherein said second region is formed along two sides of the polygon.

3. The sample support as set forth claim 1, wherein said second region surrounds said first region.

4. The sample support as set forth claim 1, further comprising a third region that is higher in wettability than said first region but lower in wettability than said second region, and wherein a distance between the first and third regions is less than a distance between the first and second regions.

5. The sample support as set forth in claim 1, wherein said sample support film is made of silicon nitride, silicon oxide, or carbon.

6. The sample support as set forth in claim 1, wherein said metal film is made of a noble metal.

7. The sample support as set forth claim 1, further comprising a sample grid for transmission electron microscopy, a sample support film formed on the sample grid and having a top surface, and a metal film formed on the sample support film and having a top surface, and wherein said first and second regions are constituted by the top surface of the sample support film and the top surface of the metal film, respectively.

8. A method of fabricating a sample support for holding a sample floating on the surface of water, comprising the steps of:
   forming a sample support film;
   forming a metal film on the sample support film; and
   forming a baseplate having a through hole;
   wherein the sample support film has: a first region on which the sample is to be placed; and a second region of higher wettability than the first region, such that the first region repels water more than the second region;
   wherein the sample support film and the metal film have top surfaces which constitute the first and second regions, respectively; and
   wherein said first region is in registry with the through hole and said second region is not in registry with the through hole.

\* \* \* \* \*

UNITED STATES PATENT AND TRADEMARK OFFICE
CERTIFICATE OF CORRECTION

| | | |
|---|---|---|
| PATENT NO. | : 11,658,000 B2 | Page 1 of 1 |
| APPLICATION NO. | : 16/916720 | |
| DATED | : May 23, 2023 | |
| INVENTOR(S) | : Konyuba et al. | |

It is certified that error appears in the above-identified patent and that said Letters Patent is hereby corrected as shown below:

In the Claims

Column 12, Line 20, In Claim 3, after "forth" insert -- in --

Column 12, Line 22, In Claim 4, after "forth" insert -- in --

Column 12, Line 28, In Claim 5, after "forth" insert -- in --

Column 12, Line 31, In Claim 6, after "forth" insert -- in --

Column 12, Line 33, In Claim 7, after "forth" insert -- in --

Signed and Sealed this
Fifteenth Day of August, 2023

Katherine Kelly Vidal
*Director of the United States Patent and Trademark Office*